(12) United States Patent
Wilson et al.

(10) Patent No.: US 6,958,092 B2
(45) Date of Patent: *Oct. 25, 2005

(54) EPITAXIAL SILICON WAFER WITH INTRINSIC GETTERING AND A METHOD FOR THE PREPARATION THEREOF

(75) Inventors: Gregory M. Wilson, Chesterfield, MO (US); Jon A. Rossi, Mountainview, CA (US); Charles C. Yang, Gilbert, AZ (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 160 days.

This patent is subject to a terminal disclaimer.

(21) Appl. No.: 10/400,594

(22) Filed: Mar. 25, 2003

(65) Prior Publication Data

US 2005/0098092 A1    May 12, 2005

Related U.S. Application Data

(62) Division of application No. 09/859,094, filed on May 16, 2001, now Pat. No. 6,537,655, which is a division of application No. 09/250,908, filed on Feb. 16, 1999, now Pat. No. 6,284,384.

(60) Provisional application No. 60/111,546, filed on Dec. 9, 1998.

(51) Int. Cl.[7] .............................................. C30B 15/02

(52) U.S. Cl. ........................ 117/23; 117/89; 117/935; 428/450; 428/310.5

(58) Field of Search .................... 117/2, 3, 89, 935; 428/450, 310.5

(56) References Cited

U.S. PATENT DOCUMENTS

| 4,314,595 A | 2/1982 | Yamamoto et al. |
|---|---|---|
| 4,376,657 A | 3/1983 | Nagasawa et al. |
| 4,437,922 A | 3/1984 | Bischoff et al. |
| 4,505,759 A | 3/1985 | O'Mara |
| 4,548,654 A | 10/1985 | Tobin |
| 4,851,358 A | 7/1989 | Huber |
| 4,868,133 A | 9/1989 | Huber |
| 5,327,007 A | 7/1994 | Imura et al. |
| 5,401,669 A | 3/1995 | Falster et al. |

(Continued)

FOREIGN PATENT DOCUMENTS

DE    43 23 964 A1    1/1994

(Continued)

OTHER PUBLICATIONS

Shimizu et al., "Excellence of Gate Oxide Integrity in metal Oxide semiconductor large scale integrated cicuits based on p/p thin film epitaxial silicon wafers", Jap. Jour. Applied Physics vol. 36 (1997) pp. 2565-2570.*

(Continued)

*Primary Examiner*—Robert Kunemund
(74) *Attorney, Agent, or Firm*—Senniger Powers

(57) ABSTRACT

A wafer is characterized in that the wafer has a non-uniform distribution of crystal lattice vacancies, wherein the concentration of crystal lattice vacancies in the bulk layer are greater than the concentration of crystal lattice vacancies in the front surface layer. In addition, the front surface of the wafer has an epitaxial layer, having a thickness of less than about 2.0 çm, deposited thereon. A process comprises heating a surface of a wafer starting material to remove a silicon oxide layer from the surface and depositing an epitaxial layer onto the surface to form an epitaxial wafer. The epitaxial wafer is then heated to a soak temperature of at least about 1175C. while exposing the epitaxial layer to an oxidizing atmosphere comprising an oxidant, and the wafer is cooled at a rate of at least about 10C./sec.

49 Claims, 4 Drawing Sheets

U.S. PATENT DOCUMENTS

| | | | |
|---|---|---|---|
| 5,403,406 A | 4/1995 | Falster et al. | |
| 5,445,975 A | 8/1995 | Gardner et al. | |
| 5,478,408 A | 12/1995 | Mitani et al. | |
| 5,487,358 A | 1/1996 | Ohta et al. | |
| 5,502,010 A | 3/1996 | Nadahara et al. | |
| 5,502,331 A | 3/1996 | Inoue et al. | |
| 5,525,549 A * | 6/1996 | Fukada et al. | 438/53 |
| 5,534,294 A | 7/1996 | Kubota et al. | |
| 5,539,245 A | 7/1996 | Imura et al. | |
| 5,561,316 A | 10/1996 | Fellner | |
| 5,587,019 A | 12/1996 | Fujie | |
| 5,593,494 A | 1/1997 | Falster | |
| 5,611,855 A | 3/1997 | Wijaranakula | |
| 5,674,756 A | 10/1997 | Satoh et al. | |
| 5,738,942 A | 4/1998 | Kubota et al. | |
| 5,788,763 A | 8/1998 | Hayashi et al. | |
| 5,820,685 A | 10/1998 | Kurihara et al. | |
| 5,939,770 A | 8/1999 | Kageyama | |
| 5,944,889 A | 8/1999 | Park et al. | |
| 6,129,787 A | 10/2000 | Adachi et al. | |
| 6,284,384 B1 * | 9/2001 | Wilson et al. | 428/450 |
| 6,537,655 B2 * | 3/2003 | Wilson et al. | 428/310.5 |

FOREIGN PATENT DOCUMENTS

| | | |
|---|---|---|
| EP | 0 503 816 B1 | 9/1992 |
| EP | 0 536 958 A1 | 4/1993 |
| EP | 0 716 168 A1 | 6/1996 |
| JP | 3-9078 | 2/1991 |
| JP | 4-10544 | 1/1992 |
| JP | 5-155700 A | 6/1993 |
| JP | 7-201874 A | 8/1995 |
| JP | 7-321120 | 12/1995 |
| JP | 7-335657 | 12/1995 |
| JP | 8-045944 | 2/1996 |
| JP | 8-045945 | 2/1996 |
| JP | 8-045947 | 2/1996 |
| JP | 8-24796 | 7/1997 |
| JP | 11-067781 A | 3/1999 |
| JP | 11-150119 A | 6/1999 |
| WO | WO 98/38675 | 9/1992 |
| WO | WO 98/45507 | 10/1998 |

OTHER PUBLICATIONS

Abe et al, "Defect free surfaces of bulk wafers by combination of RTA and crystal growth conditions".*

T. Abe, "Innovated Silicon Crystal Growth And Wafering Technologies", Electrochemical Soc. Proc., vol. 97, No. 3, 1997, pp. 123-133.

T. Abe, "Defect-Free Surfaces Of Bulk Wafers By Combination OF RTA And Crystal Growth Conditions", (publication information unknown).

Falster, R., et al., "The Engineering of Silicon Wafer Material Properties Through Vacancy Concentration Profile Control and the Achievement of Ideal Oxygen Precipitation Behavior", Mat. Res. Soc. Symp. Proc., vol. 510, 1998, pp. 27-35.

Hawkins, et al., "Effect of Rapid Thermal Processing on Oxygen Precipitation in Silicon", Mat. Res. Soc. Symp. Proc., vol. 104, 1988, pp. 197-200.

Hawkins, et al., "The Effect of Rapid Thermal Annealing on the Precipitation of Oxygen in Silicon", J. Appl. Phys., vol. 65, No. 9, 1989, pp. 3644-3654.

Herng-Der Chiou, "The Effects of Preheatings on Axial Oxygen Precipitation Uniformity in Czochralski Silicon Crystals", J. Electrochem. Soc., vol. 139, No. 6, Jun., 1992.

Hirofumi et al., "Excellence of Gate Oxide Integrity in Metal-Oxide-Semiconductor Large-Scale-Integrated Circuits Based on $P^-/P^-$ Thin-Film Epitaxial Silicon Wafers", Jpn. J. Appl. Phys., vol. 36, 1997, pp. 2565-2570.

A. Hara et al., "Enhancement Of Oxygen Precipitation in Quenched Czochralski Silicon Crystals", Journal of Applied Phys., vol. 66, No. 8, 1989, pp. 3958-3960.

Jacob, M., et al., "Influence of RTP on Vacancy Concentrations", Mat. Res. Soc. Symp. Proc., vol. 490, 1998, pp. 129-134.

Kern, W., "The Evolution of Silicon Wafer Cleaning Technology", J. Electrochem. Soc., vol. 137, No. 6, 1990, pp. 1887-1892.

Nadahara, et al., "Hydrogen Annealed Silicon Wafer", Solid State Phenomena, vols. 57-58, 1997, pp. 19-26.

Pagani, M., et al., "Spatial variations in oxygen precipitation in silicon after high temperature rapid thermal annealing", Appl. Phys. Lett., vol. 70, No. 12, 1998, pp. 1572-1574.

Schmolke et al., "Defect Depth Profile in Si(100) p/p Epitaxial Wafers", The Electrochem Soc. Proc., vol. 98, No. 1, 1998, pp. 855-866.

Shimizu, Hirofumi et al., "Effects Of Surface Defects (COPs) On Isolation Leakage And Gate Oxide Integrity In MOS Large-Scale-Integrated-Circuit Devices And Cost Effective p-/p- Epitaxial Wafers", Electrochemical Society Proceedings, vol. 99-1, pp. 315-323 (from a presentation on or about May 3, 1999).

F. Shimura, "Semiconductor Silicon Crystal Technology", Academic Press, Inc., San Diego, CA, 1989, pp. 361-377.

R. Winkler et al., "Improvement Of The Gate Oxide Integrity By Modifying Crystal Pulling And Its Impact On Device Failures", J. Electrochem. Soc., vol. 141, No. 5, 1994, pp. 1398-1401.

H. Zimmerman et al., "Vacancy Concentration Wafer Mapping In Silicon", J. Crystal Growth, vol. 129, 1993, pp. 582-592.

* cited by examiner

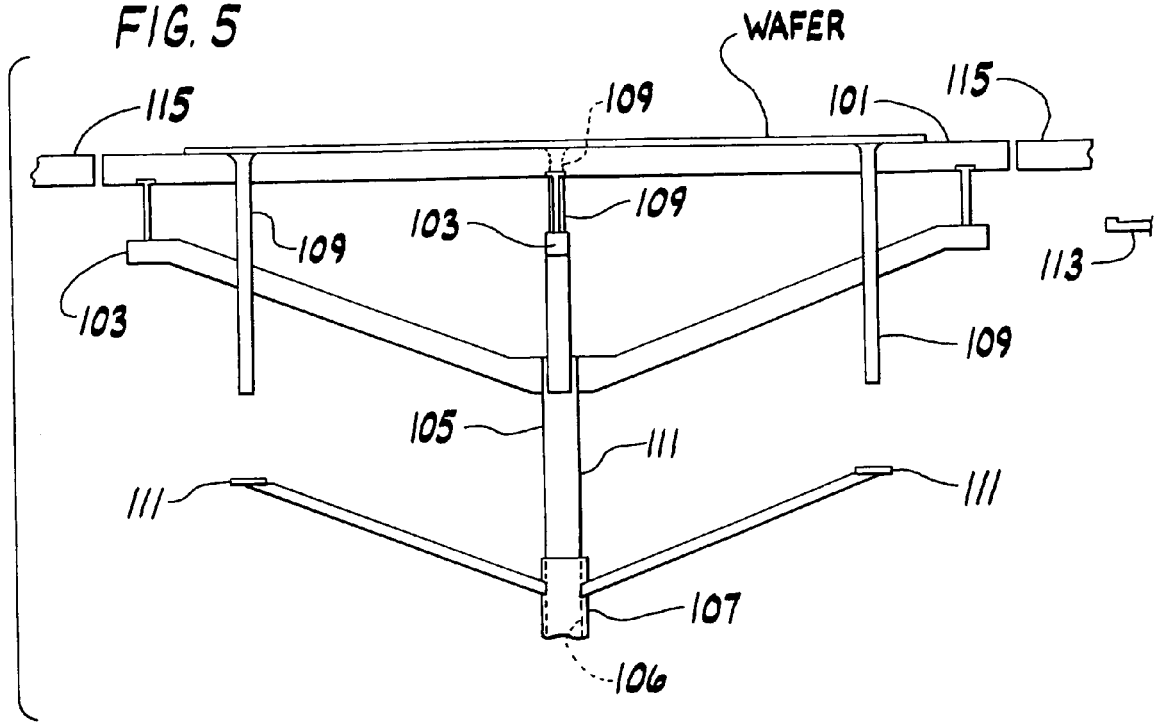
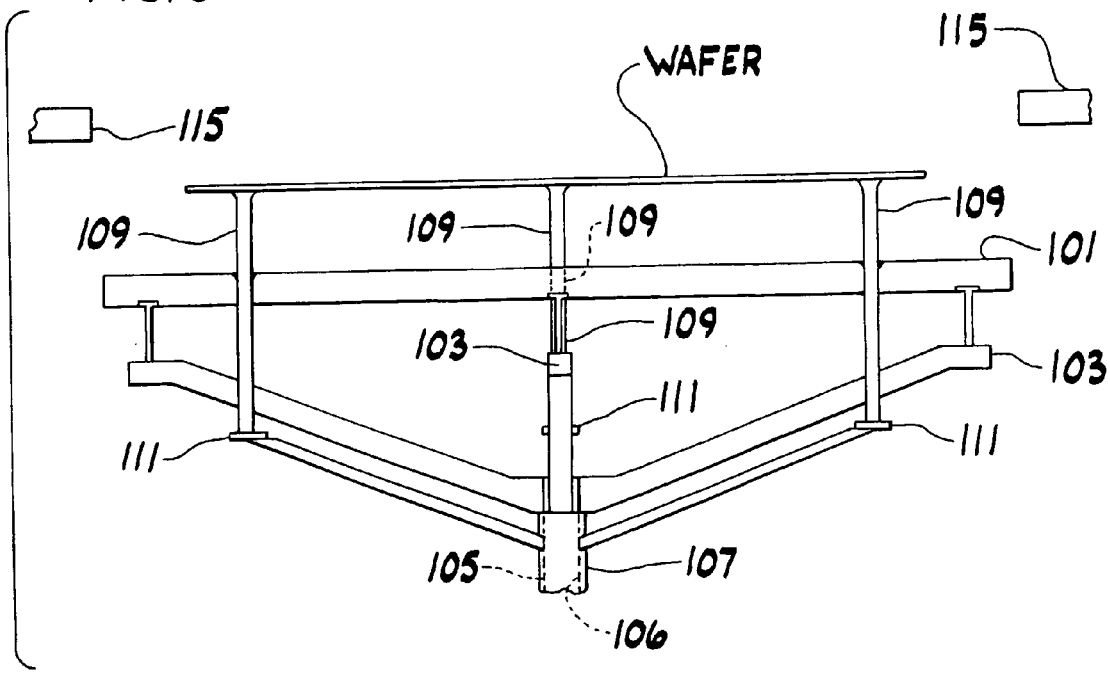

EPITAXIAL SILICON WAFER WITH INTRINSIC GETTERING AND A METHOD FOR THE PREPARATION THEREOF

CROSS-REFERENCE TO RELATED APPLICATION

This is a division of application Ser. No. 09/859,094, filed May 16, 2001, now U.S. Pat. No. 6,537,655, which is a division of application Ser. No. 09/250,908, filed Feb. 16, 1999, now U.S. Pat. No. 6,284,384, which claims the benefit of U.S. Provisional Application No. 60/111,546, filed Dec. 9, 1998.

BACKGROUND OF THE INVENTION

The present invention generally relates to the preparation of semiconductor material substrates, especially silicon wafers, which are used in the manufacture of electronic components. More particularly, the present invention relates to a single crystal silicon wafer and a method for the preparation thereof. This wafer comprises a surface having an epitaxial silicon layer deposited thereon, and forms an ideal, non-uniform depth distribution of oxygen precipitates during the heat treatment cycles of essentially any electronic device manufacturing process.

Single crystal silicon, which is the starting material for most processes used to fabricate semiconductor electronic components, is commonly prepared by using the Czochralski ("Cz") process. Using this method, polycrystalline silicon ("polysilicon") is charged to a crucible and melted, a seed crystal is brought into contact with the molten silicon, and a single crystal is grown by slow extraction. The first portion of the crystal to be formed during the extraction process is a thin neck. After formation of the neck is complete, the diameter of the crystal is enlarged by decreasing the pulling rate and/or the melt temperature until the desired or target diameter is reached. A cylindrical main body of the crystal which has an approximately constant diameter is then grown by controlling the pull rate and the melt temperature while compensating for the decreasing melt level. Near the end of the growth process, but before the crucible is emptied of molten silicon, the crystal diameter is reduced gradually to form an end-cone. Typically, the end-cone is formed by increasing the crystal pull rate and heat supplied to the crucible. When the diameter becomes small enough, the crystal is then separated from the melt.

A number of defects in single crystal silicon form in the crystal growth chamber as the crystal cools after solidification. Such defects arise, in part, due to the presence of an excess (i.e., a concentration above the solubility limit) of intrinsic point defects, which are known as crystal lattice vacancies and silicon self-interstitials. Silicon crystals grown from a melt are typically grown with an excess of one or the other type of intrinsic point defect. It has been suggested that the type and initial concentration of these point defects in the silicon are determined at the time of solidification and, if these concentrations reach a level of critical supersaturation in the system and the mobility of the point defects is sufficiently high, a reaction (or an agglomeration event) will likely occur. The density of agglomerated intrinsic point defects in Cz silicon is conventionally within the range of about $1\times10^3/cm^3$ to about $1\times10^7/cm^3$. While these values are relatively low, agglomerated intrinsic point defects are of rapidly increasing importance to device manufacturers and, in fact, are now seen as yield-limiting factors in device fabrication processes and can severely impact the yield potential of the material in the production of complex and highly integrated circuits.

One particularly problematic type of defect is the presence of crystal originated pits ("COPs"). The source of this type of defect is the agglomeration of silicon lattice vacancies. More specifically, when silicon lattice vacancies agglomerate within a silicon ingot, they form voids. Typically, these voids have an octahedral shape and a characteristic size of at least about 0.01 $\mu$m. When the ingot is sliced into wafers, these voids are exposed and appear as pits on the surfaces of the wafers. These pits are referred to as COPs.

To date, there generally are three main approaches to dealing with the problem of agglomerated intrinsic point defects. The first approach includes methods which focus on crystal pulling techniques to reduce the number density of agglomerated intrinsic point defects in the ingot. This approach can be further subdivided into those methods having crystal pulling conditions which result in the formation of vacancy dominated material, and those methods having crystal pulling conditions which result in the formation of self-interstitial dominated material. For example, it has been suggested that the number density of agglomerated defects can be reduced by (i) controlling $v/G_0$ (where v is the growth velocity and $G_0$ is the average axial temperature gradient) to grow a crystal in which crystal lattice vacancies are the dominant intrinsic point defect, and (ii) influencing the nucleation rate of the agglomerated defects by altering (generally, by slowing down) the cooling rate of the silicon ingot from about 1100° C. to about 1050° C. during the crystal pulling process. While this approach reduces the number density of agglomerated defects, it does not prevent their formation. As the requirements imposed by device manufacturers become more and more stringent, the presence of these defects will continue to become more of a problem.

Others have suggested reducing the pull rate during the growth of the body of the crystal to a value less than about 0.4 mm/minute. This suggestion, however, is also not satisfactory because such a slow pull rate leads to reduced throughput for each crystal puller. More importantly, such a pull rate leads to the formation of single crystal silicon having a high concentration of self-interstitials. This high concentration, in turn, leads to the formation of agglomerated self-interstitial defects and all the resulting problems associated with such defects.

A second approach to dealing with the problem of agglomerated intrinsic point defects includes methods which focus on the dissolution or annihilation of agglomerated intrinsic point defects subsequent to their formation. Generally, this is achieved by using high temperature heat treatments of the silicon in wafer form. For example, in European Patent Application No. 503,816 A1, Fusegawa et al. propose growing the silicon ingot at a growth rate in excess of 0.8 mm/minute, and heat treating the wafers which are sliced from the ingot at a temperature in the range of 1150° C. to 1280° C. to reduce the defect density in a thin region near the wafer surface. The specific treatment needed will vary depending on the concentration and location of agglomerated intrinsic point defects in the wafer. Different wafers cut from a crystal which does not have a uniform axial concentration of such defects may require different post-growth processing conditions. Further, such wafer heat treatments are relatively costly, have the potential for introducing metallic impurities into the silicon wafers, and are not universally effective for all types of crystal-related defects.

A third approach to dealing with the problem of agglomerated intrinsic point defects is the epitaxial deposition of a thin crystalline layer of silicon onto the surface of a single crystal silicon wafer. This process provides a single crystal silicon wafer having a surface which is substantially free of agglomerated intrinsic point defects. Use of the traditional epitaxial deposition techniques, however, substantially increases the cost of the wafer.

In addition to containing the above-discussed agglomerated point defects, single crystal silicon prepared by the Cz method also typically contains various impurities, among which is mainly oxygen. This contamination, for example, occurs while the molten silicon is contained in the quartz crucible. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of electronic devices. Thus, as the crystal grows from the molten mass and cools, the solubility of oxygen in it decreases rapidly. This ultimately results in wafers containing oxygen in supersaturated concentrations.

Thermal treatment cycles which are typically employed in the fabrication of electronic devices can cause the precipitation of oxygen in silicon wafers which are supersaturated in oxygen. Depending on their location in the wafer, the precipitates can be harmful or beneficial. Oxygen precipitates located in the active device region of the wafer (i.e., typically near the surface) can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Historically, electronic device fabrication processes have included a series of steps which were designed to produce silicon having a region near the surface of the wafer which is free of oxygen precipitates (commonly referred to as a "denuded zone" or a "precipitate-free zone") with the balance of the wafer (i.e., the wafer bulk) containing a sufficient number of oxygen precipitates for IG purposes. Denuded zones have been formed, for example, in a high-low-high thermal sequence such as (a) oxygen out-diffusion heat treatment at a high temperature (>1100° C.) in an inert gas for a period of at least about 4 hours, (b) oxygen precipitate nuclei formation at a low temperature (600 to 750° C.), and (c) growth of oxygen ($SiO_2$) precipitates at a high temperature (1000 to 1150° C.). See, e.g., F. Shimura, *Semiconductor Silicon Crystal Technology*, pp. 361–367 (Academic Press, Inc., San Diego Calif., 1989) (and the references cited therein).

More recently, however, advanced electronic device manufacturing processes, such as DRAM manufacturing processes, have begun to minimize the use of high temperature process steps. Although some of these processes retain enough of the high temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions. As a result, IG potential is lost.

In Japanese Patent Application No. 8-24796, Asayama et al. disclose a process for imparting intrinsic gettering into a wafer before it is used in an electronic device manufacturing process. Specifically, Asayama et al. disclose: (a) baking silicon wafers at 1150° C. in a $H_2$ atmosphere; (b) depositing epitaxial layers onto the surfaces of the wafers at temperatures of 1100, 1150, and 1200° C.; and (c) cooling the wafers at rates of 5, 10, and 15° C./sec. The wafers analyzed by Asayama et al. had a resistivity of no greater than 0.5 Ω-cm and an oxygen density of $11 \times 10^{17}$ atoms/$cm^3$ (in other words, about 22 ppm (i.e., 22 oxygen atoms per 1,000,000 total atoms in the wafer)). Asayama et al. conclude that if the process is used with a temperature of from 1150 to 1250° C. and a cooling rate of 10 to 100° C./sec, such wafers will form a desirable oxygen precipitate profile upon being heated over a period of time at a temperature of from 700 to 1000° C.

SUMMARY OF THE INVENTION

Among the objects of the present invention is the provision of a single crystal silicon wafer which (a) has an epitaxial surface that is essentially free of crystal originated pits; and (b) forms an ideal, non-uniform depth distribution of oxygen precipitates during a heat treatment cycle of essentially any electronic device manufacturing process.

Briefly, therefore, this invention is directed to a single crystal silicon wafer comprising: (a) two major generally parallel surfaces (i.e., the front and back surfaces); (b) a central plane between and parallel to the front and back surfaces; (c) a front surface layer which comprises the region of the wafer extending a distance, $D_1$, of at least about 10 μm from the front surface toward the central plane; and (d) a bulk layer which comprises the region of the wafer extending from the central plane to the front surface layer. This wafer is characterized in that the wafer has a non-uniform distribution of crystal lattice vacancies wherein (a) the concentration of crystal lattice vacancies in the bulk layer is greater than the concentration of crystal lattice vacancies in the front surface layer, (b) the crystal lattice vacancies have a concentration profile having a peak density of crystal lattice vacancies at or near the central plane, and (c) the concentration of crystal lattice vacancies generally decreases from the position of peak density toward the front surface of the wafer. In addition, the front surface of the wafer has an epitaxial layer deposited thereon. This epitaxial layer has a thickness of from about 0.1 to about 2.0 μm.

In another embodiment directed to a single crystal silicon wafer, the wafer comprises: (a) two major generally parallel surfaces (i.e., a front surface and a back surface); (b) a central plane between and parallel to the front and back surfaces; (c) a front surface layer which comprises the region of the wafer extending a distance, $D_2$, of at least about 10 μm from the front surface toward the central plane; and (d) a bulk layer which comprises the region of the wafer extending from the central plane to the front surface layer. In this embodiment, the wafer has a non-uniform distribution of crystal lattice vacancies wherein (a) the concentration of crystal lattice vacancies in the bulk layer is greater than the concentration of crystal lattice vacancies in the front surface layer, (b) the crystal lattice vacancies have a concentration profile having a peak density of crystal lattice vacancies at or near the central plane, and (c) the concentration of crystal lattice vacancies generally decreases from the position of peak density toward the front surface of the wafer. In addition, the front surface of the wafer has an epitaxial layer deposited thereon. This epitaxial layer comprises a surface having an average light scattering event concentration of no greater than about 0.06/cm$^2$, as measured by a laser-based auto inspection tool configured to detect light scattering events corresponding to polystyrene spheres having diameters of no less than about 0.12 $\mu$m. Also in this embodiment, the bulk layer comprises voids which are at least about 0.01 $\mu$m in their largest dimension.

In an additional embodiment directed to a single crystal silicon wafer, the wafer comprises: (a) two major generally parallel surfaces (i.e., the front and back surfaces), (b) a central plane between and parallel to the front and back surfaces, (c) a front surface layer comprising the region of the wafer extending a distance of no more than about 100 $\mu$m from the front surface toward the central plane, and (d) a bulk layer comprising the region of the wafer extending from the central plane to the front surface layer. In this embodiment, the bulk layer has a substantially uniform oxygen concentration and a concentration of crystal lattice vacancies such that upon subjecting the wafer to an oxygen precipitation heat treatment consisting essentially of annealing the wafer at 800° C. for about 4 hours and then at 1000° C. for 16 hours, the wafer will contain oxygen precipitates having a concentration profile in which the peak density of the precipitates in the bulk layer is at or near the central plane with the concentration of the precipitates in the bulk layer generally decreasing in the direction of the front surface layer. In addition, the front surface of the wafer has an epitaxial layer deposited thereon. This epitaxial layer has a thickness of from about 0.1 to about 2.0 $\mu$m.

In a further embodiment directed to a single crystal silicon wafer, the wafer comprises: (a) two major generally parallel surfaces (i.e., a front surface and a back surface), (b) a central plane between and parallel to the front and back surfaces, (c) a front surface layer comprising the region of the wafer extending a distance of no more than about 100 $\mu$m from the front surface toward the central plane, and (d) a bulk layer comprising the region of the wafer extending from the central plane to the front surface layer. In this embodiment, the bulk layer has a substantially uniform oxygen concentration and a concentration of crystal lattice vacancies such that upon subjecting the wafer to an oxygen precipitation heat treatment consisting essentially of annealing the wafer at 800° C. for about 4 hours and then at 1000° C. for 16 hours, the wafer will contain oxygen precipitates having a concentration profile in which the peak density of the precipitates in the bulk layer is at or near the central plane with the concentration of the precipitates in the bulk layer generally decreasing toward the front surface layer. The bulk layer also comprises voids which are at least about 0.01 $\mu$m in their largest dimension. The front surface of the wafer has an epitaxial layer deposited thereon. This epitaxial layer comprises a surface having an average light scattering event concentration of no greater than about 0.06/cm$^2$, as measured by a laser-based auto inspection tool configured to detect light scattering events corresponding to polystyrene spheres having diameters of no less than about 0.12 $\mu$m.

This invention is also directed to a process for the preparation of a silicon wafer comprising a surface having an epitaxial layer deposited thereon. In one embodiment, the process comprises first heating a surface of a wafer starting material in an oxidant-free atmosphere to remove a silicon oxide layer from the surface. Within about 30 seconds after removing the silicon oxide layer from the surface, the surface is exposed to an atmosphere comprising silicon to deposit a silicon epitaxial layer onto the surface to form an epitaxial wafer. The epitaxial wafer is then heated to a soak temperature of at least about 1175° C. while exposing the epitaxial layer to an oxidizing atmosphere comprising an oxidant. Afterwards, the heated epitaxial wafer is cooled at a rate of at least about 10° C./sec.

In another embodiment directed to a process for the preparation of a silicon wafer comprising a surface having an epitaxial layer deposited thereon, the process comprises first heating a surface of a wafer starting material to a temperature of at least about 1100° C. in an oxidant-free atmosphere to remove a silicon oxide layer from the surface. Within about 30 seconds after the surface reaches 1100° C., the surface is exposed to an atmosphere comprising silicon to deposit a silicon epitaxial layer onto the surface to form an epitaxial wafer. The epitaxial wafer is then heated to a soak temperature of at least about 1175° C. while exposing the epitaxial layer to an oxidizing atmosphere comprising an oxidant. Afterwards, the heated epitaxial wafer is cooled at a rate of at least about 10° C./sec.

In another embodiment directed to a process for the preparation of a silicon wafer comprising a surface having an epitaxial layer deposited thereon, the process comprises first heating a surface of a wafer starting material to a temperature of at least about 1150° C. in an oxidant-free atmosphere to remove a silicon oxide layer from the surface. Within about 30 seconds after the surface reaches 1150° C., the surface is exposed to an atmosphere comprising silicon to deposit a silicon epitaxial layer onto the surface to form an epitaxial wafer. The epitaxial wafer is then heated to a soak temperature of at least about 1175° C. while exposing the epitaxial layer to an oxidizing atmosphere comprising an oxidant. Afterwards, the heated epitaxial wafer is cooled at a rate of at least about 10° C./sec.

In an additional embodiment directed to a process for the preparation of a silicon wafer comprising a surface having an epitaxial layer deposited thereon, the process comprises first depositing an epitaxial layer onto a surface of a wafer to form an epitaxial wafer. The epitaxial wafer is then heated to a soak temperature of at least about 1175° C. while exposing the epitaxial layer to an oxidizing atmosphere comprising an oxidant. Afterwards, the heated epitaxial wafer is cooled at a rate of at least about 10° C./sec. In this embodiment, the epitaxial layer is not contacted with a post-epitaxial-deposition cleaning solution before the epitaxial wafer is heated to the soak temperature.

In a further embodiment directed to a process for the preparation of a silicon wafer comprising a surface having an epitaxial layer deposited thereon, the process comprises first heating a wafer comprising a surface with an epitaxial layer deposited thereon to a soak temperature of at least about 1175° C. while exposing the epitaxial layer to an oxidizing atmosphere comprising an oxidant. The heated wafer is then cooled at a rate of at least about 10° C./sec. In this embodiment, the epitaxial layer has a thickness of at least about 0.1 $\mu$m and less than 2.0 $\mu$m.

In another embodiment directed to a process for the preparation of a silicon wafer comprising a surface having an epitaxial layer deposited thereon, the process comprises first depositing an epitaxial layer onto a surface of a wafer starting material to form an epitaxial wafer. The epitaxial wafer is heated to a soak temperature of at least about 1175° C. while exposing the epitaxial layer to an oxidizing atmosphere comprising an oxidant. Afterwards, the heated epitaxial wafer is cooled at a rate of at least about 10° C./sec. In this embodiment, the surface of the wafer starting material (before the epitaxial layer is deposited onto the surface)

has an average light scattering event concentration of at least about $0.5/cm^2$ as measured by a laser-based auto inspection tool configured to detect light scattering events corresponding to polystyrene spheres having diameters of no less than about 0.12 µm.

In yet another embodiment directed to a process for the preparation of a silicon wafer comprising a surface having an epitaxial layer deposited thereon, the process comprises first heating a surface of a wafer starting material to a temperature of at least about 1150° C. in an atmosphere consisting essentially of $H_2$ to remove a silicon oxide layer from the surface. Within about 10 seconds after the surface reaches 1150° C., the surface is exposed to an atmosphere comprising $SiHCl_3$ to deposit a silicon epitaxial layer onto the surface to form an epitaxial wafer. The epitaxial wafer is then heated to a soak temperature of at least about 1175° C. while exposing the epitaxial layer to an oxidizing atmosphere comprising $O_2$. Afterwards, the epitaxial wafer is cooled at a rate of at least about 20° C./sec from the soak temperature to about 250° C. below the soak temperature. In this embodiment, the epitaxial layer has a thickness of from about 0.65 to 1.0 µm, and the concentration of the $O_2$ in the oxidizing atmosphere is from about 300 to about 500 ppm.

This invention is also directed to a process for heating and rapidly cooling a single crystal silicon wafer in a reactor constructed for depositing a silicon epitaxial layer onto a surface of a wafer. This process comprises heating the wafer to a soak temperature of at least about 1175° C., and cooling the heated wafer at a rate of at least about 10° C./sec. In this embodiment, the wafer is supported on a susceptor during the heating step and is removed from contact with the susceptor during the cooling step.

Other features of this invention will be in part apparent and in part pointed out hereinafter.

BRIEF DESCRIPTION OF THE DRAWINGS

FIG. 5 is a schematic diagram of the mechanism used in an EPI CENTURA® reactor for positioning a wafer within the reactor. In this figure, the susceptor support shaft 105 and wafer lift shaft 107 are in the process position.

FIG. 6 is a schematic diagram of the mechanism used in an EPI CENTURA® reactor for positioning a wafer within the reactor. This figure shows the preferred position of the susceptor support shaft 105 and wafer lift shaft 107 when the wafer is being rapidly cooled in accordance with this invention to influence the crystal lattice vacancy profile in the wafer.

DETAILED DESCRIPTION OF THE PREFERRED EMBODIMENT

In accordance with the present invention, a novel and useful single crystal silicon wafer comprising a surface having an epitaxial silicon layer deposited thereon has been developed. The epitaxial surface of the wafer typically has an average light scattering event concentration of no greater than about $0.06/cm^2$, as measured by a laser-based auto inspection tool configured to detect light scattering events corresponding to polystyrene spheres having diameters of no less than about 0.12 µm. In addition, the wafer contains a "template" that determines (or "prints") the manner in which oxygen will precipitate when the wafer is heated during the electronic device manufacturing process. Thus, during a heating step of essentially any electronic device manufacturing process, the wafer will form (a) a denuded zone of sufficient depth, and (b) a wafer bulk containing a sufficient density of oxygen precipitates for IG purposes. Also in accordance with this invention, a novel method has been developed for preparing such a single crystal silicon wafer. This method may be completed in a matter of minutes using tools which are in common use in the silicon semiconductor manufacturing industry.

A. Starting Material

The starting material for the ideal precipitating wafer of the present invention preferably is a single crystal silicon wafer which has been sliced from a single crystal ingot grown in accordance with any of the conventional variations of the Cz crystal growing method. This method, as well as standard silicon slicing, lapping, etching, and polishing techniques, are well known in the art and disclosed, for example, in F. Shimura, *Semiconductor Silicon Crystal Technology* (Academic Press, 1989); and *Silicon Chemical Etching*, (J. Grabmaier, ed., Springer-Verlag, New York, 1982).

Figure 1:
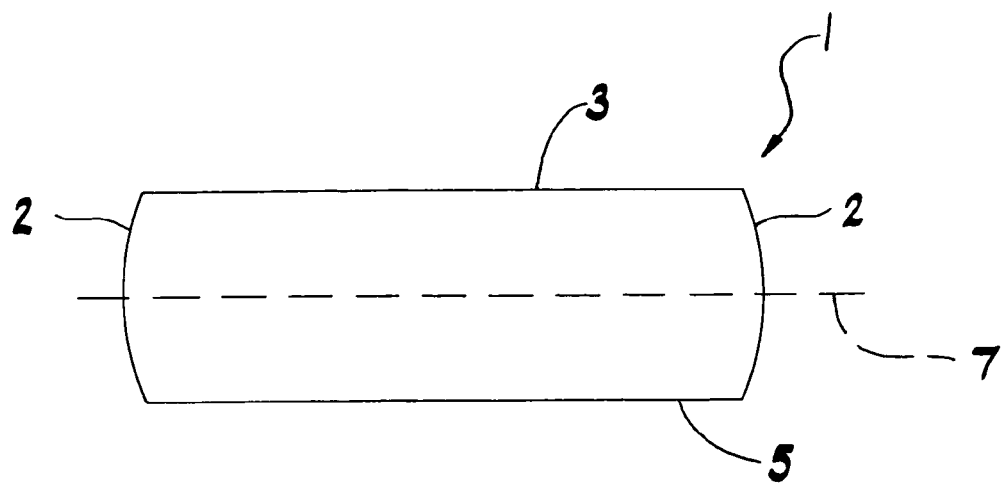
FIG. 1 shows the preferred structure of a single crystal silicon wafer that may be used as the starting material in accordance with the instant invention.

Referring to FIG. 1, the wafer 1 preferably has a front surface 3, a back surface 5, an imaginary central plane 7 between the front and back surfaces, and a circumferential edge 2 joining the front surface 3 and the back surface 5. The terms "front" and "back" in this context are used to distinguish the two major, generally planar surfaces of the wafer 1. It should be noted that the front surface 3 is not necessarily the surface on which an electronic device will subsequently be fabricated, nor is the back surface 5 necessarily the major surface of the wafer 1 which is opposite the surface on which the electronic device is fabricated. In addition, because silicon wafers typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

The wafer may contain one or more dopants to give the wafer various desired properties. For example, the wafer may be a P-type wafer (i.e., a wafer that has been doped with an element from Group 3 of the Periodic Table, most typically boron) or an N-type wafer (i.e., a wafer that has been doped with an element from Group 5 of the Periodic Table, most typically arsenic). Preferably, the wafer is a P-type wafer having a resistivity of from about 0.004 to about 50 Ω-cm. In a particularly preferred embodiment, the wafer is a P-type wafer having a resistivity of from about 1 to about 20 Ω-cm. In another particularly preferred embodiment, the wafer is a P-type wafer having a resistivity of from about 0.01 to 1.0 Ω-cm.

A wafer prepared using the Cz method typically has an oxygen concentration anywhere from about $5\times10^{17}$ to about $9\times10^{17}$ atoms/cm$^3$ (in other words, from about 10 to about 18 ppm (i.e., from about 10 to about 18 oxygen atoms per 1,000,000 total atoms in the wafer)) (ASTM standard F-121-80), and most typically from about $6\times10^{17}$ to about $8.5\times10^{17}$ atoms/cm$^3$ (i.e., from about 12 to about 17 ppm). The oxygen precipitation behavior of the wafer becomes essentially decoupled from the oxygen concentration in the ideal precipitating wafer; thus, the wafer starting material may have an oxygen concentration falling anywhere within or even outside the range attainable by the Cz method. In addition, depending on the cooling rate of the single crystal silicon ingot from the melting point of silicon (i.e., about 1410° C.) through the range of about 750° C. to about 350° C., oxygen precipitate nucleation centers may form. The presence or absence of these nucleation centers in the starting material typically is not critical to the present invention provided that these centers are capable of being dissolved by heat-treating the silicon at temperatures not in excess of about 1250° C.

This invention is particularly useful when used with void-rich wafer starting materials. The phrase "void-rich wafers" refers to wafers that contain a relatively large number of crystal lattice vacancy agglomerations. These agglomerations typically have octahedral structures which are at least about 0.01 μm in their largest dimension. In the bulk of the wafer, these agglomerations are in the form of voids; whereas at the surface of the wafer, they appear in the form of pits (i.e., COPs). Pits on the surface of a wafer may be detected by a laser-based auto inspection tool (sometimes referred to as a "laser-based surface inspection tool" or a "wafer surface particle counter"), which detects light scattering events emitted by the pits when the surface is scanned by the tool's laser. Examples of suitable commercially available auto inspection tools include the Surfscan 6220 from KLA Tencor (Mountain View, Calif.); and the CR80, CR81, and CR82 from ADE Optical Systems Corp. (Charlotte, N.C.). Void-rich wafer starting materials which are particularly preferable for use with this invention have an average light scattering event concentration of at least about 0.5/cm$^2$, as measured by a laser-based auto inspection tool configured to detect light scattering events corresponding to polystyrene spheres having diameters of no less than about 0.12 μm. More preferably, this average light scattering event concentration is from about 0.5 to about 10/cm$^2$, still more preferably from about 0.5 to about 3.5/cm$^2$, and most preferably from about 0.6 to about 1.6/cm$^2$. Void-rich wafers are particularly preferred starting materials because they may be sliced from silicon ingots formed by relatively low-cost processes, e.g., the traditional open-architecture Cz processes.

B. Epitaxial Deposition

The single crystal silicon wafer prepared in accordance with this invention comprises a surface having an epitaxial silicon layer deposited thereon. The epitaxial layer may be deposited onto the entire wafer, or, alternatively, onto only a portion of the wafer. Referring to FIG. 1, the epitaxial layer preferably is deposited onto the front surface 3 of the wafer. In a particularly preferred embodiment, it is deposited onto the entire front surface 3 of the wafer. Whether it is preferred to have an epitaxial layer deposited onto any other portion of the wafer will depend on the intended use of the wafer. For most applications, the existence or non-existence of an epitaxial layer on any other portion of the wafer is not critical.

As noted earlier, single crystal silicon wafers sliced from ingots prepared by the Cz method often have COPs on their surfaces. A wafer used for integrated circuit fabrication, however, generally is required to have a surface which consists essentially of no COPs. A wafer having an essentially COP-free surface may be prepared by depositing an epitaxial silicon layer onto the surface of the wafer. Such an epitaxial layer fills in the COPs and ultimately produces a smooth wafer surface. This has been the topic of recent scientific investigations. See Schmolke et al., *The Electrochem. Soc. Proc.*, vol. PV98-1, p. 855 (1998); Hirofumi et al., *Jpn. J. Appl. Phys.*, vol. 36, p. 2565 (1997). Applicants have discovered in accordance with this invention that COPs on a wafer surface may be eliminated by using an epitaxial silicon layer thickness of at least about 0.1 μm. Preferably, the epitaxial layer has a thickness of at least about 0.1 μm and less than about 2 μm. More preferably, the epitaxial layer has a thickness of from about 0.25 to about 1 μm, and most preferably from about 0.65 to about 1 μm.

It should be noted that the preferred thickness of the epitaxial layer may vary if the epitaxial layer is used to impart electrical properties to the wafer surface in addition to eliminating COPs. For example, precise control of a dopant concentration profile near the wafer surface may be achieved using an epitaxial layer. Where an epitaxial layer is used for a purpose in addition to eliminating COPs, such a purpose may require an epitaxial layer thickness which is greater than the preferred thickness used to eliminate the COPs. In such an instance, the minimum thickness to achieve the additional desired effect preferably is used. Depositing a thicker layer onto the wafer is generally less commercially desirable because forming the thicker layer requires a greater deposition time and more frequent cleaning of the reaction vessel.

If a wafer has a silicon oxide layer (e.g., a native silicon oxide layer, which forms on a silicon surface when it is exposed to air at room temperature and generally has a thickness of from about 10 to about 15 Å) on its surface, the silicon oxide layer preferably is removed from the surface of the wafer before the epitaxial layer is deposited onto the surface. As used herein, the phrase "silicon oxide layer" refers to a layer of silicon atoms which are chemically bound to oxygen atoms. Typically, such a silicon oxide layer contains about 2.0 oxygen atoms per silicon atom.

In a preferred embodiment of this invention, removal of the silicon oxide layer is preferably accomplished by heating the surface of the wafer in an atmosphere consisting essentially of no oxidants (most preferably, the atmosphere is oxidant-free) until the silicon oxide layer is removed from the surface. In a particularly preferred embodiment, the surface of the wafer is heated to a temperature of at least about 1100° C., and more preferably to a temperature of at least about 1150° C. This heating preferably is conducted while exposing the surface of the wafer to an atmosphere comprising a noble gas (e.g., He, Ne, or Ar), $H_2$, HF gas, or a combination thereof. More preferably, the atmosphere comprises HF gas, $H_2$, or a combination thereof; atmospheres comprising a noble gas tend to cause pits to form in the surface of the wafer. Most preferably, the atmosphere consists essentially of $H_2$. It should be noted that although atmospheres containing $N_2$ may be used, such atmospheres are less preferred because they tend to form nitrides on the surface which interfere with subsequent epitaxial deposition on the surface.

Traditionally, the epitaxial deposition protocols that remove a silicon oxide layer by heating a wafer in the presence of $H_2$ require the wafer to be heated to a high temperature (e.g., from about 1000 to about 1250° C.) and then baked at that temperature for a period of time (i.e., typically from about 10 to about 90 seconds). It has been discovered in accordance with this invention, however, that if the surface of the wafer is heated to about 1100° C. (and more preferably, about 1150° C.) in an atmosphere comprising $H_2$, the silicon oxide layer is removed without the subsequent bake step, thereby rendering the bake step unnecessary. Elimination of the bake step shortens the time required to prepare the wafer and therefore is commercially desirable.

In a preferred embodiment of this invention, the wafer surface is heated to remove the silicon oxide layer, and then the surface is exposed to an atmosphere containing silicon to deposit the epitaxial layer onto the surface. More preferably, the surface is exposed with the atmosphere containing silicon less than 30 seconds after the silicon oxide is removed, more preferably within about 20 seconds after the silicon oxide layer is removed, and most preferably within about 10 seconds after the silicon oxide layer is removed. In a particularly preferred embodiment, the wafer surface is heated to a temperature of at least about 1100° C. (more preferably, at least about 1150° C.), and then is exposed to an atmosphere containing silicon less than 30 seconds after the wafer surface reaches that temperature. More preferably, the surface is exposed to the atmosphere containing silicon within 20 seconds after the wafer surface reaches that temperature, and most preferably less within 10 seconds after the wafer surface reaches that temperature. Waiting to initiate silicon deposition for about 10 seconds after removal of the silicon oxide layer allows the temperature of the wafer to stabilize and become uniform.

During the removal of the silicon oxide layer, the wafer preferably is heated at a rate which does not cause slip. More specifically, if the wafer is heated too quickly, a thermal gradient will develop which will create an internal stress sufficient to cause different planes within the wafer to shift relative to each other (i.e., slip). Lightly doped wafers (e.g., a wafer doped with boron and having a resistivity of about 1 to about 10 Ω-cm) have been found to be particularly susceptible to slip. To avoid this problem, the wafer preferably is heated from room temperature to the silicon oxide removal temperature at an average rate of about 20 to about 35° C./sec.

The epitaxial deposition preferably is carried out by chemical vapor deposition. Generally speaking, chemical vapor deposition involves exposing the surface of the wafer to an atmosphere comprising silicon in an epitaxial deposition reactor, e.g., an EPI CENTURA® reactor (Applied Materials, Santa Clara, Calif.). In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (most preferably $H_2$). In one embodiment, the source of silicon during the epitaxial deposition is $SiH_2Cl_2$ or $SiH_4$. If $SiH_2Cl_2$ is used, the reactor pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air leaking into the reactor chamber is lessened.

During the epitaxial deposition, the temperature of the wafer surface preferably is maintained at a temperature sufficient to prevent the atmosphere comprising silicon from depositing polycrystalline silicon onto the surface. Generally, the temperature of the surface during this period preferably is at least about 900° C. More preferably, the temperature of the surface is maintained at from about 1050 to about 1150° C. Most preferably, the temperature of the surface is maintained at the silicon oxide removal temperature.

The rate of growth of the epitaxial deposition preferably is from about 3.5 to about 4.0 µm/min when the deposition is conducted under atmospheric pressure. This may be achieved, for example, by using an atmosphere consisting essentially of about 2.5 mole % $SiHCl_3$ and about 97.5 mole % $H_2$ at a temperature of about 1150° C.

If the intended use of the wafer requires that the epitaxial layer include a dopant, the atmosphere comprising silicon also preferably contains the dopant. For example, it is often preferable for the epitaxial layer to contain boron. Such a layer may be prepared by, for example, including $B_2H_6$ in the atmosphere during the deposition. The mole fraction of $B_2H_6$ in the atmosphere needed to obtain the desired properties (e.g., resistivity) will depend on several factors, such as the amount of boron out-diffusion from the particular substrate during the epitaxial deposition, the quantity of P-type dopants and N-type dopants that are present in the reactor and substrate as contaminants, and the reactor pressure and temperature. Applicants have successfully used an atmosphere containing about 0.03 ppm of $B_2H_6$ (i.e., about 0.03 mole of $B_2H_6$ per 1,000,000 moles of total gas) at a temperature of about 1125° C. and a pressure of about 1 atm. to obtain an epitaxial layer having a resistivity of about 10 Ω-cm.

Once an epitaxial layer having the desired thickness has been formed, the atmosphere comprising silicon preferably is purged from the reaction chamber with a noble gas, $H_2$, or a combination thereof; and more preferably with $H_2$ alone. Afterward, the wafer preferably is cooled to a temperature of no greater than about 700° C. and then removed from the epitaxial deposition reactor.

Conventional epitaxial deposition protocols typically include a cleaning step following epitaxial deposition to remove byproducts formed during the epitaxial deposition. This step is used to prevent time-dependent haze, which results if such byproducts react with air. In addition, this step typically forms a silicon oxide layer on the epitaxial surface which tends to passivate (i.e., protect) the surface. Conventional post-epitaxial-deposition cleaning methods entail, for example, immersing the epitaxial surface in any of a number of cleaning solutions which are well-known to those of ordinary skill in the art. These solutions include, for example, piranha mixtures (i.e., mixtures of sulfuric acid and hydrogen peroxide), SC-1 mixtures (i.e., mixtures of $H_2O$, $H_2O_2$, and $NH_4OH$, also known as "RCA standard clean 1"), and SC-2 mixtures (i.e., mixtures of $H_2O$, $H2O_2$, and HCl, also known as "RCA standard clean 2"). See, e.g., W. Kern, "The Evolution of Silicon Wafer Cleaning Technology," *J. Electrochem. Soc.*, Vol. 137, No. 6, 1887-92

(1990). Many such post-epitaxial-deposition cleaning steps require expensive wet cleaning equipment, large volumes of ultra-pure chemicals, additional wafer handling which often leads to additional yield losses It has been discovered in accordance with this invention, however, that the post-epitaxial-deposition cleaning step is generally not necessary before conducting the next step (i.e., the heat treatment step discussed below in Section C). This is presently believed to be due to the fact that the heat treatment step is conducted in an atmosphere comprising an oxidant, preferably oxygen gas. The oxidant is believed to react with the epitaxial deposition byproducts left on the wafer surface after the deposition. This reaction between the oxidant and the byproducts produces volatile substances which desorb from the wafer surface. In addition to removing the epitaxial deposition byproducts, the oxidant also forms an oxide layer on the epitaxial layer which passivates the epitaxial layer. Thus, there is no need to use a conventional post-epitaxial-deposition cleaning treatment (particularly a treatment comprising contacting the wafer with a post-epitaxial-deposition cleaning solution) before conducting the next step of this invention.

Figure 2:
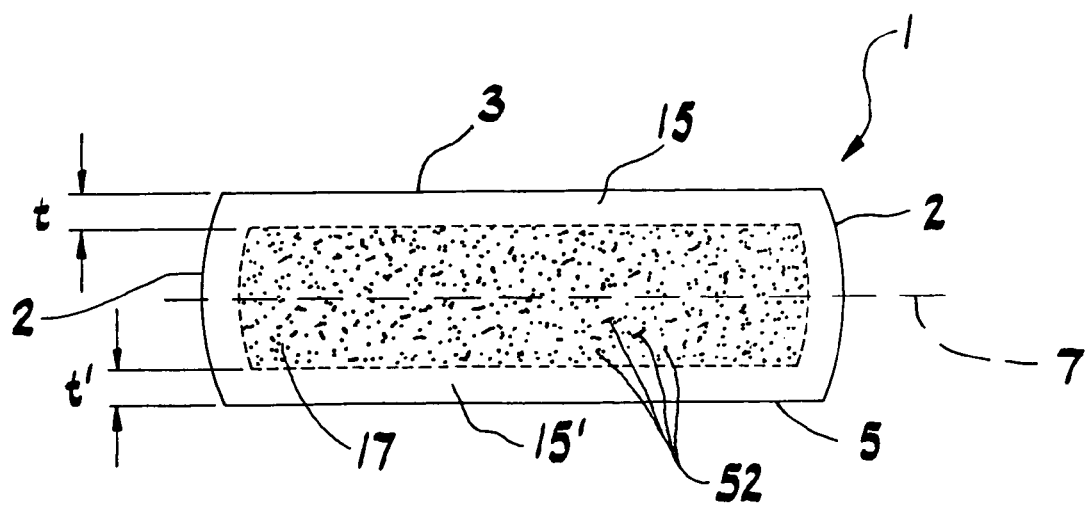
FIG. 2 shows an oxygen precipitate profile of a wafer which may be prepared in accordance with a preferred embodiment of the instant invention.

C. Heat Treatment to Influence the Precipitation Behavior of Oxygen in the Wafer in a Subsequent Thermal Processing Step After epitaxial deposition, the wafer is treated to form a template of crystal lattice vacancies within the wafer which causes an ideal, non-uniform depth distribution of oxygen precipitates to form within the wafer when the wafer is heat-treated, such as during a heat treatment cycle of essentially any electronic device manufacturing process. FIG. 2 shows one such oxygen precipitate distribution which may be formed by heat-treating a wafer prepared in accordance with this invention. In this particular embodiment, the wafer 1 is characterized by regions 15 and 15' ("denuded zones") which are free of oxygen precipitates. These zones extend from the front surface 3 and back surface 5 to a depth of t and t', respectively. Preferably, t and t' are each from about 10 to about 100 $\mu$m, and more preferably from about 50 to about 100 $\mu$m. Between the oxygen precipitate-free regions 15 and 15', there is a region 17 which contains a substantially uniform concentration of oxygen precipitates. For most applications, the oxygen precipitate concentration in region 17 is at least about $5 \times 10^8$ precipitates/Cm$^3$, and more preferably is about $1 \times 10^9$ precipitates/cm$^3$. It should be recognized that the purpose of FIG. 2 is to help acquaint those skilled in the art with this invention by illustrating merely one embodiment of this invention. This invention is not limited to that embodiment. For example, this invention may also be used to form a wafer having only one denuded zone 15 (instead of two denuded zones 15 and 15').

To form the template of crystal lattice vacancies, the wafer generally is first heated in an oxidizing atmosphere comprising an oxidant, and then cooled at a rate of at least about 10° C./sec. The purpose of heating the wafer is to: (a) form self-interstitial and vacancy pairs (i.e., Frenkel defects) in the crystal lattice which are distributed uniformly throughout the wafer, and (b) dissolve unstabilized oxygen precipitate nucleation centers present in the wafer. Generally, heating to greater temperatures results in a greater number of Frenkel defects being formed. The purpose of the cooling step is to produce a non-uniform distribution of crystal lattice vacancies, wherein the vacancy concentration is maximum at or near the center of the wafer, and decreases in the direction of the surfaces of the wafer. This non-uniform distribution of crystal lattice vacancies is believed to be caused by the fact that a portion of vacancies near the surfaces of the wafer diffuse to the surfaces during the cool down and thereby become annihilated, resulting in lower concentrations of vacancies near the surfaces.

For most applications, the wafer preferably is heated in the oxidizing atmosphere to a soak temperature of at least about 1175° C. More preferably, it is heated to a soak temperature of from about 1200 to about 1300° C., and most preferably from about 1225 to about 1250° C. When the temperature of the wafer reaches the preferred soak temperature, the wafer temperature preferably is held at the soak temperature for a period of time. The preferred amount of time generally is from about 10 to about 15 seconds. In a typical presently commercially available epitaxial deposition reactor, the wafer preferably is held at the soak temperature for about 12 to about 15 seconds. In a typical presently commercially available RTA furnace, on the other hand, the wafer preferably is held at the soak temperature for about 10 seconds.

In one embodiment of this invention, the oxidizing atmosphere comprises $H_2O$ and $H_2$. More preferably, however, the oxidant in the oxidizing atmosphere is oxygen gas, which is present in the atmosphere at a concentration of at least about 300 ppm (i.e., 300 moles of $O_2$ per 1,000,000 moles of total gas). More preferably, the oxygen concentration is from about 300 to about 2000 ppm, and most preferably from about 300 to about 500 ppm. The remainder of the oxidizing atmosphere preferably consists essentially of a gas which will not react with the silicon surface or the oxidant. More preferably, the remainder of the gas consists essentially of a noble gas or $N_2$, more preferably a noble gas, and most preferably Ar. The oxidizing atmosphere preferably is exposed to at least the epitaxial surface during the heating. More preferably, the oxidizing atmosphere is exposed to essentially the entire surface of the wafer. Most preferably, the oxidizing atmosphere is exposed to the entire surface of the wafer, minus the portion of the wafer which is in contact with the structure supporting the wafer in the furnace.

Following the heat treatment of the wafer in the oxidizing atmosphere, the wafer is rapidly cooled. This cooling step may conveniently be carried out in the same oxidizing atmosphere in which the heat-treatment is conducted. Alternatively, it preferably is carried out in an atmosphere that will not react with the wafer surface. Preferably, the wafer is cooled at a rate of at least about 10° C./sec. More preferably, the wafer is cooled at a rate of at least about 15° C./sec., even more preferably at least about 20° C./sec., and most preferably at least about 50° C./sec. This rapid cooling rate preferably is used as the temperature of the wafer decreases through the range of temperatures at which crystal lattice vacancies diffuse through the single crystal silicon. Once the wafer is cooled to a temperature outside the range of temperatures at which crystal lattice vacancies are relatively mobile, the cooling rate does not significantly influence the precipitating characteristics of the wafer, and, thus, is not narrowly critical. Generally, crystal lattice vacancies are relatively mobile at temperatures greater than about 1000° C.

In a particularly preferred embodiment, the average cooling rate of the wafer is at least about 10° C./sec. (more preferably at least about 15° C./sec., still more preferably at least about 20° C./sec., and most preferably at least about 50° C./sec.) as its temperature falls from the soak temperature to a temperature which is about 150° C. less than the soak temperature. In another particularly preferred embodiment, the average cooling rate of the wafer is at least about 10° C./sec. (more preferably at least about 15° C./sec., still more preferably at least about 20° C./sec., and most preferably at least about 50° C./sec.) as its temperature falls from the soak temperature to a temperature which is about 250° C. less than the soak temperature.

The heating and rapid cool-down may be carried out, for example, in any of a number of commercially available rapid thermal annealing ("RTA") furnaces in which wafers are heated by banks of high power lamps. RTA furnaces are capable of rapidly heating a silicon wafer. For example, many are capable of heating a wafer from room temperature to 1200° C. in a few seconds. Examples of suitable commercially available furnaces include the model 610 furnace from AG Associates (Mountain View, Calif.) and the CENTURA® RTP from Applied Materials (Santa Clara, Calif.).

Figure 3:
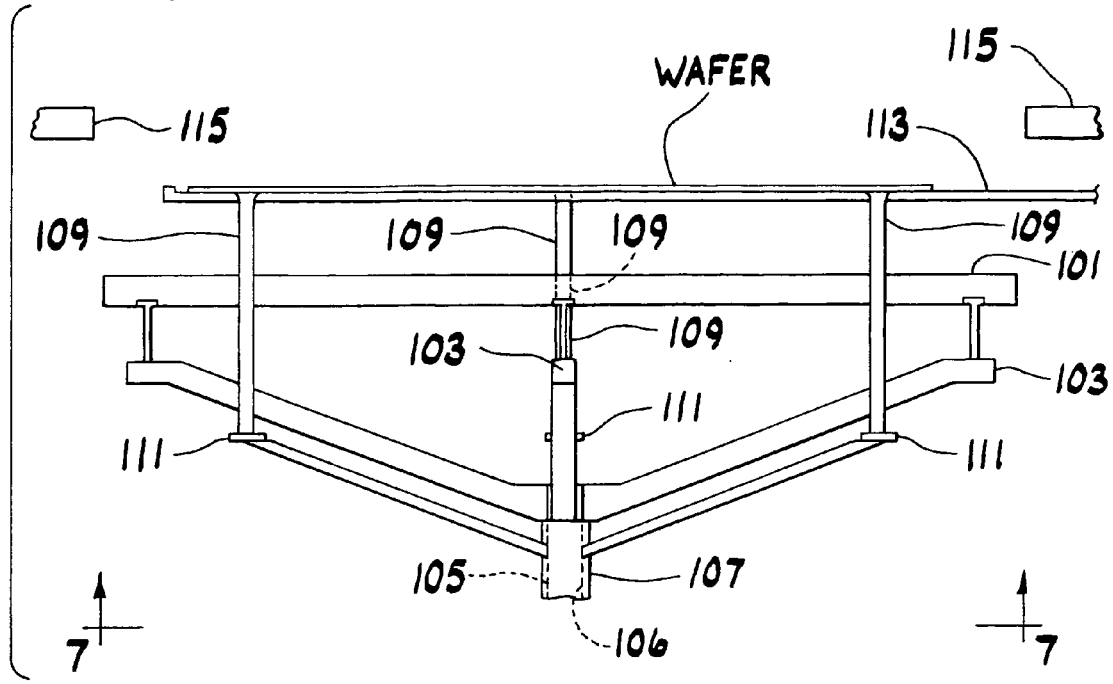
FIG. 3 is a schematic diagram of the mechanism used in an EPI CENTURA® reactor (Applied Materials, Santa Clara, Calif.) for positioning a wafer within the reactor. In this figure, the susceptor support shaft 105 and wafer lift shaft 107 are in the exchange position.
Figure 7:
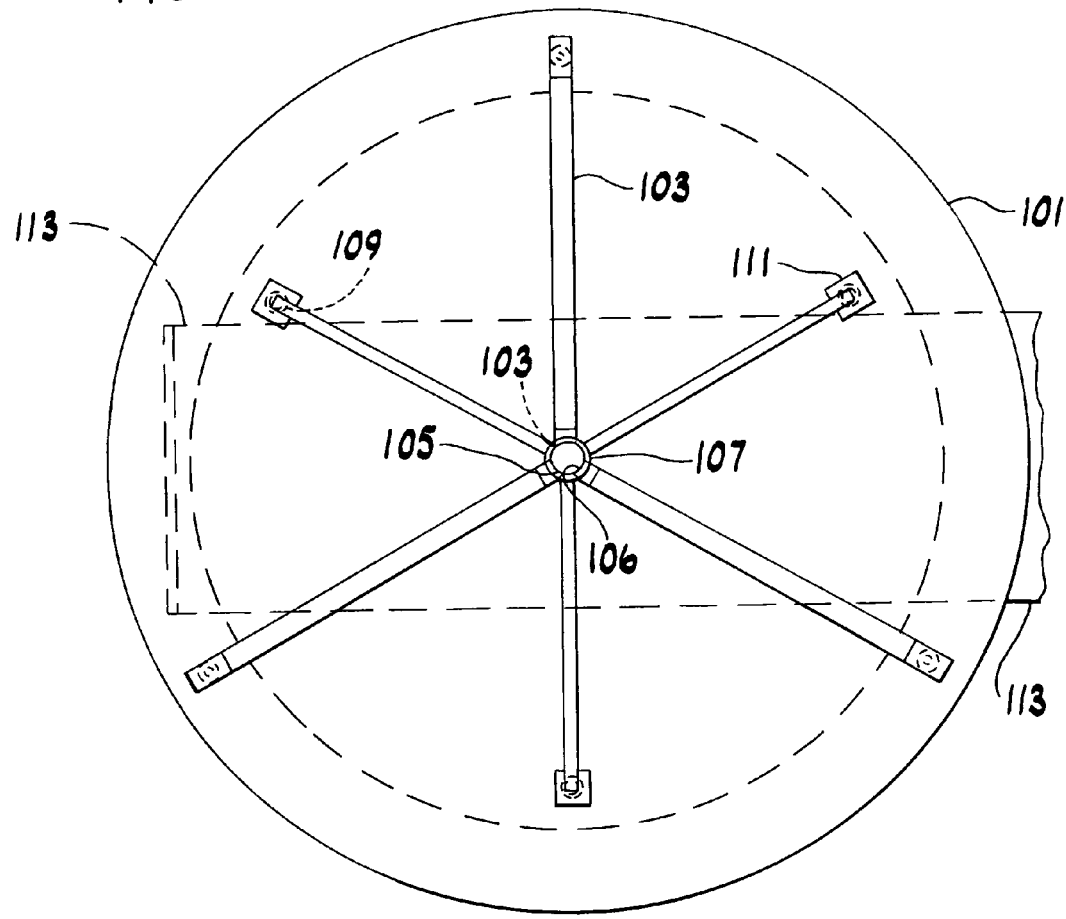
FIG. 7 is a cross-sectional view of the mechanism used in an EPI CENTURA® reactor for positioning a wafer within the reactor. This view is taken from line 7—7 in FIG. 3.

Alternatively, the heating and rapid cool-down may be carried out in an epitaxial deposition reactor, provided that the desired cooling rate can be achieved in the reactor. Applicants have determined that the heating and cooling steps can be carried out in an EPI CENTURA® reactor. Referring to FIG. 3 and FIG. 7, such a reactor includes a susceptor 101 for supporting a wafer. The susceptor 101 is fixedly mounted on arms 103 of a susceptor support shaft 105 slidingly mounted within a bore 106 of a wafer lift shaft 107. The wafer lift shaft is mounted for vertical movement within a cylindrical opening in a lower dome (not shown) of the reactor. A pneumatic mechanism (not shown) is operable to move the susceptor support shaft 105 and the wafer lift shaft 107 vertically, either together or independently as desired. The mechanism is further operable to rotate the susceptor support shaft 105 within the bore 106 so that the susceptor 101 and wafer may be rotated. The susceptor includes rigid pins 109 slidingly mounted in openings in the susceptor to engage stops 111 of the wafer lift shaft at their lower ends. The upper ends of the pins 109 are capable of supporting the wafer. Conventionally, the pins 109 have only been used to support the wafer during transfer to and from the reactor.

Figure 4:
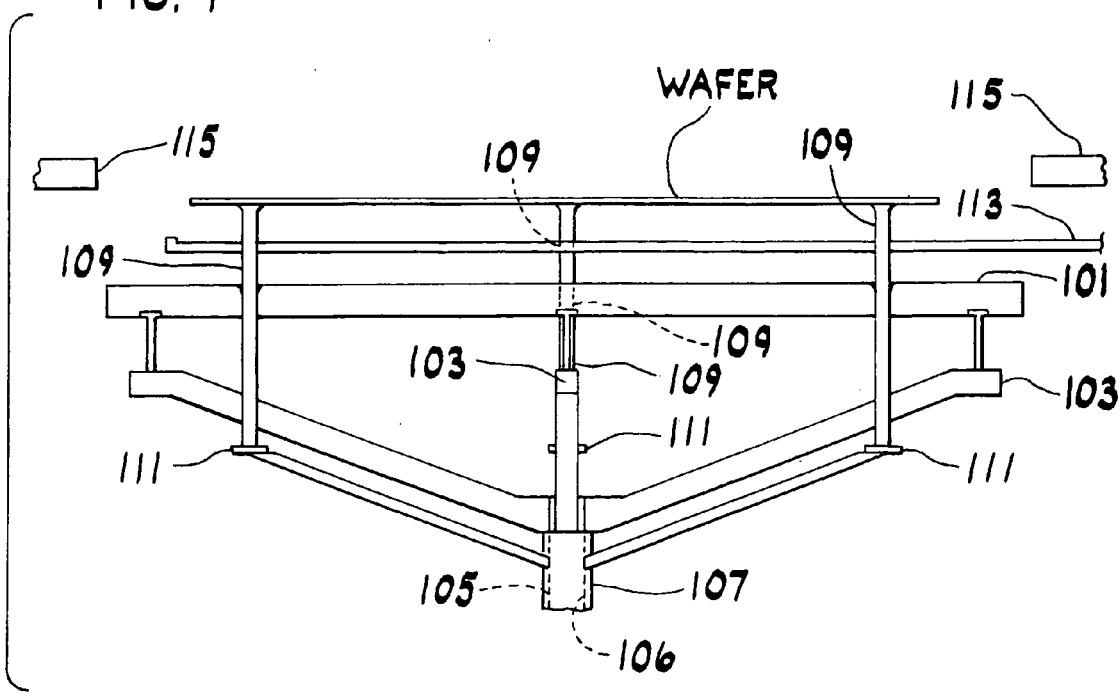
FIG. 4 is a schematic diagram of the mechanism used in an EPI CENTURA® reactor for positioning a wafer within the reactor, wherein the susceptor support shaft 105 and wafer lift shaft 107 are in the home position.

To position the wafer for heat-treatment in the EPI CENTURA® reactor, the wafer is delivered to the reactor, such as by blade 113, which is sized to fit between the rigid pins 109 (see FIG. 7). The susceptor support shaft 105 and wafer lift shaft 107 are moved upward from the exchange position shown in FIG. 3 to the home position shown in FIG. 4. The upward motion of the susceptor support shaft 105 causes the pins 109 (which are engaged with the wafer lift shaft 107) to engage the back surface of the wafer and lift the wafer off of the blade 113. The blade is thereafter removed from the reactor. Referring to FIG. 5, the susceptor support shaft 105 is then moved further upward while the wafer lift shaft 107 remains stationary. This causes the pins 109 to slide downwardly relative to the susceptor 101 until the upper surface of the susceptor 101 is brought into contact with the wafer. Thereafter, the susceptor 101 supports the wafer. Meanwhile, the support shaft 105 continues to move upward until the susceptor 101 is coplanar with ring 115. At this point, the susceptor is in the process position. A bank of high power lamps (not shown) is then activated to heat the wafer while it is supported by the susceptor 101 in the process position. Preferably, the susceptor 101 and wafer are rotated while being heated so that the wafer is heated more uniformly.

It has been found that the typical average cooling rate (i.e., about 10 to 15° C./sec.) of a wafer in the EPI CENTURA® reactor tends to be far less than the typical average cooling rate (i.e., about 70 to 100° C./sec) that may be achieved in an RTA furnace at temperatures where crystal lattice vacancies are relatively mobile. This is, in part, due to the fact that the susceptor 101 (see FIG. 5), which is in contact with the wafer, remains hot for some time after heating is completed. To increase the cooling rate, therefore, the wafer preferably is moved to a position as far as possible from the susceptor 101. This may be accomplished by lowering the susceptor support shaft 105 to the exchange position shown in FIG. 6 immediately after heating is complete. In the exchange position, the wafer is supported only by the pins 109, so that substantially all the back surface and all the front surface of the wafer are not in contact with any other solid hot surfaces (besides the pins 109). Further, the wafer is positioned as far as possible from the hot susceptor 101. By lifting the wafer off of the susceptor 101, the rate of cooling of the wafer may be approximately doubled (i.e., the average rate of cooling increases from a range of from about 10 to 15° C./sec to a range of from about 25 to about 30° C./sec).

The non-uniform vacancy profile prepared in accordance with this invention is a template for oxygen precipitation when the wafer is subsequently heated. Specifically, when the wafer 1 (see FIG. 2) is heated, oxygen will cluster rapidly to form precipitates 52 in the region 17 of the wafer 1 containing higher concentrations of vacancies, but will tend not to cluster in the regions 15 and 15' near the wafer surfaces 3 and 5 which contain lower concentrations of vacancies. Typically, the oxygen nucleates at temperatures of from about 500 to about 800° C., and grows precipitates at temperatures of from about 700 to about 1000° C. Thus, for example, the non-uniform distribution of oxygen precipitates 52 in a wafer may be formed during a heat treatment cycle of an electronic device manufacturing process, given that such heat treatment cycles often are conducted at temperatures near 800° C.

Figure 8:
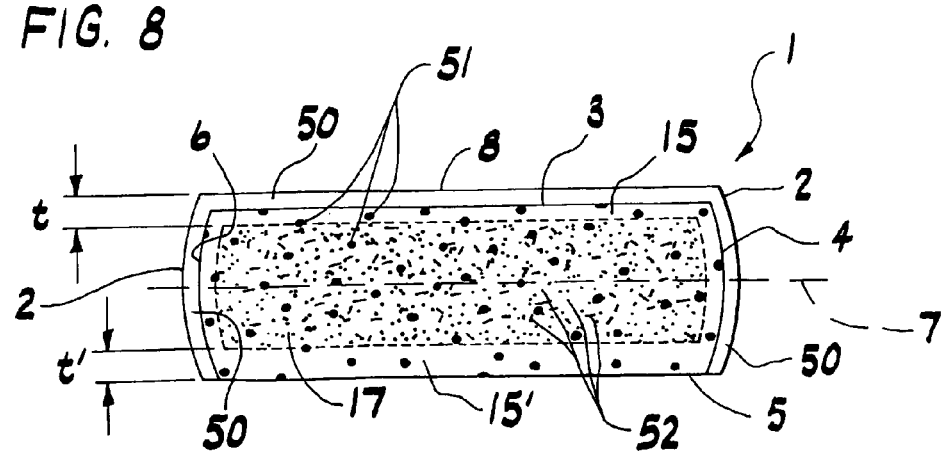
FIG. 8 shows an oxygen precipitate profile of a wafer which may be prepared in accordance with a preferred embodiment of the instant invention where the starting material is a void-rich single crystal silicon wafer.

As discussed previously, it is particularly advantageous to use this invention to treat a void-rich wafer starting material, which has a relatively large number of COPs on its surface and voids within its bulk. FIG. 8 shows an example of a crystal lattice vacancy agglomerate 51 profile and oxygen precipitate 52 profile for an epitaxial wafer prepared from a void-rich wafer starting material using the process of the instant invention, followed by heat-treatment. An epitaxial layer 50 is on the outer surfaces 3, 4, and 6 (no epitaxial layer is on the back surface 5 in this particular embodiment) of the wafer 1. Because the epitaxial layer has filled in essentially all the COPs, the wafer has smooth, essentially COP-free surface 2 and 8. Preferably, this epitaxial surface has an average light scattering event concentration of no greater than about $0.06/cm^2$, as measured by a laser-based auto inspection tool configured to detect light scattering events corresponding to polystyrene spheres having diameters of no less than about 0.12 $\mu$m. The profile of the oxygen precipitates 52 is similar to the oxygen precipitate profile in FIG. 2, and is sufficient for intrinsic gettering. The profile of the vacancy agglomerates 51 completely within the bulk (i.e., the profile of the voids within the bulk) of the wafer 1 essentially remains the same throughout the process of this invention, and does not tend to affect the surfaces 2 and 8 of the wafer 1 due to the existence of the epitaxial layer 50, which acts as a barrier between the surfaces 2 and 8 and the agglomerates 51. Thus, this invention is commercially useful, in part, because it enables the formation of a silicon wafer having intrinsic gettering ability and an essentially COP-free surface from a void-rich wafer starting material, which may be prepared with relatively low cost.

If a void-rich wafer starting material is used, the wafer produced in accordance with this invention typically may be characterized in that a surface on the wafer may be produced which has an average light scattering event concentration of at least about 0.5/cm² (as measured by a laser-based auto inspection tool configured to detect light scattering events corresponding to polystyrene spheres having diameters of no less than about 0.12 µm) if the epitaxial layer and a layer of silicon extending at least 0.2 µm beneath the epitaxial layer (i.e., a layer which has a thickness of at least 0.2 µm as measured from the epitaxial layer toward the central plane of the wafer) is removed from the wafer. In a particularly preferred embodiment, this light scattering event concentration is from about 0.5 to about 10/cm², more preferably from about 0.5 to about 3.5/cm², and most preferably from about 0.6 to about 1.6/cm². The epitaxial layer and the additional layer of silicon may be removed from the front surface by various polishing and cleaning techniques which are generally known and accepted by those skilled in the art. Preferably, the polishing and cleaning technique is capable, under at least some circumstances, of polishing and cleaning a surface of a single crystal silicon wafer having a resistivity of less than about 0.02 Ω-cm to form a surface having an average light scattering event concentration of no greater than about 0.2/cm² (again, as measured by a laser-based auto inspection tool configured to detect light scattering events corresponding to polystyrene spheres having diameters of no less than about 0.12 µm).

The above description of the preferred embodiment is intended only to acquaint others skilled in the art with the invention, its principles, and its practical application, so that others skilled in the art may adapt and apply the invention in its numerous forms, as may be best suited to the requirements of a particular use. The present invention, therefore, is not limited to the above embodiments, and may be variously modified.

We claim:

1. A single crystal silicon wafer comprising: (a) two major generally parallel surfaces, one of which is a front surface of the wafer and the other of which is a back surface of the wafer; (b) a central plane between and parallel to the front and back surfaces; (c) a front surface layer which comprises the region of the wafer extending a distance, $D_1$, of at least about 10 µm from the front surface toward the central plane; and (d) a bulk layer which comprises the region of the wafer extending from the central plane to the front surface layer, the wafer being characterized in that:

the wafer has a non-uniform distribution of crystal lattice vacancies wherein (a) the bulk layer has a crystal lattice vacancy concentration which is greater than in the front surface layer, (b) the crystal lattice vacancies have a concentration profile having a peak density of crystal lattice vacancies at or near the central plane, and (c) the concentration of crystal lattice vacancies generally decreases from the position of peak density toward the front surface of the wafer; and the front surface of the wafer has an epitaxial layer deposited thereon, the epitaxial layer having a thickness of at least about 0.1 µm.

2. The single crystal silicon wafer of claim 1 wherein $D_1$ is from about 50 to about 100 µm.

3. The single crystal silicon wafer of claim 1 wherein the resistivity of the wafer is 1.0 to about 20 Ω-cm.

4. A single crystal silicon wafer comprising: (a) two major generally parallel surfaces, one of which is a front surface of the wafer and the other of which is a back surface of the wafer; (b) a central plane between and parallel to the front and back surfaces; (c) a front surface layer comprising the region of the wafer extending a distance of no greater than about 100 µm from the front surface toward the central plane; and (d) a bulk layer comprising the region of the wafer extending from the central plane to the front surface layer, wherein the bulk layer has a substantially uniform oxygen concentration and a concentration of crystal lattice vacancies such that upon subjecting the wafer to an oxygen precipitation heat treatment consisting essentially of annealing the wafer at 800° C. for about 4 hours and then at 1000° C. for 16 hours, the wafer will contain oxygen precipitates having a concentration profile in which the peak density of the precipitates in the bulk layer is at or near the central plane with the concentration of the precipitates in the bulk layer generally decreasing toward the front surface layer; and the front surface of the wafer has an epitaxial layer deposited thereon, the epitaxial layer having a thickness of at least about 0.1 µm.

5. A process for the preparation of a silicon wafer comprising a surface having an epitaxial layer deposited thereon, the process comprising:

heating a surface of a wafer starting material in an essentially oxidant-free atmosphere to remove a silicon oxide layer from the surface;

within about 30 seconds after removing the silicon oxide layer from the surface, exposing the surface to an atmosphere comprising silicon to deposit a silicon epitaxial layer onto the surface to form an epitaxial wafer;

heating the epitaxial wafer to a soak temperature of at least about 1175° C. while exposing the epitaxial layer to an oxidizing atmosphere comprising an oxidant; and cooling the heated epitaxial wafer at a rate of at least about 10° C./sec.

6. The process of claim 5 wherein the oxidant in the oxidizing atmosphere is $O_2$.

7. The process of claim 5 wherein the cooling rate is at least about 15° C./sec.

8. The process of claim 5 wherein, while the wafer starting material is exposed to the atmosphere comprising silicon, the wafer starting material is maintained at an epitaxial deposition temperature at which the atmosphere comprising silicon will not deposit polycrystalline silicon onto the heated surface when the atmosphere is contacted with the heated surface.

9. The process of claim 5 wherein the wafer starting material is maintained at an epitaxial deposition temperature of at least about 900° C. while the wafer starting material is exposed to the atmosphere comprising silicon.

10. The process of claim 5 wherein the wafer starting material is maintained at an epitaxial deposition temperature of from about 1050 to about 1150° C. while the wafer starting material is exposed to the atmosphere comprising silicon.

11. The process of claim 5 wherein the silicon oxide layer is removed from the surface of the wafer starting material by heating the surface to a temperature of at least about 1150° C.

12. The process of claim 5 wherein within about 10 seconds after removing the silicon oxide layer from the surface, the surface is exposed to the atmosphere comprising silicon to deposit the silicon epitaxial layer onto the surface to form the epitaxial wafer.

13. A process for the preparation of a silicon wafer comprising a surface having an epitaxial layer deposited thereon, the process comprising:

heating a surface of a wafer starting material to a temperature of at least about 1100° C. in an essentially oxidant-free atmosphere to remove a silicon oxide layer from the surface, within about 30 seconds after the surface reaches 1100° C., exposing the surface to an atmosphere comprising silicon to deposit a silicon epitaxial layer onto the surface to form an epitaxial wafer, heating the epitaxial wafer to a soak temperature of at least about 1175° C. while exposing the epitaxial layer to an oxidizing atmosphere comprising an oxidant, and cooling the heated epitaxial wafer at a rate of at least about 10° C./sec.

14. The process of claim 13 wherein the atmosphere comprising silicon comprises $SiCl_4$, $SiHCl_3$, $SiH_2Cl_2$, $SiH_3Cl$, or $SiH_4$.

15. The process of claim 13 wherein the atmosphere comprising silicon comprises $SiHCl_3$.

16. The process of claim 13 wherein the wafer starting material is maintained at an epitaxial deposition temperature of at least about 900° C. while the wafer starting material is exposed to the atmosphere comprising silicon.

17. The process of claim 13 wherein the cooling rate is at least about 15° C./sec.

18. The process of claim 13 wherein the average cooling rate of the wafer is at least about 15° C./sec as it cools from the soak temperature to about 150° C. below the soak temperature.

19. The process of claim 13 wherein the cooling rate is at least about 20° C./sec.

20. The process of claim 13 wherein the average cooling rate of the wafer is at least about 20° C./sec as it cools from the soak temperature to about 150° C. below the soak temperature.

21. The process of claim 13 wherein the cooling rate is at least about 50° C./sec.

22. The process of claim 13 wherein the average cooling rate of the wafer is at least about 50° C./sec as it cools from the soak temperature to about 150° C. below the soak temperature.

23. The process of claim 13 wherein the resistivity of the wafer starting material is 1.0 to about 20 Ω-cm.

24. The process of claim 13 wherein the epitaxial wafer is maintained at the soak temperature for from about 10 to about 15 seconds before it is cooled.

25. The process of claim 13 wherein the process comprises:
heating the surface of the wafer starting material to a temperature of at least about 1100° C. in the essentially oxidant-free atmosphere to remove the silicon oxide layer from the surface, and
within about 20 seconds after the surface reaches 1100° C., exposing the surface to the atmosphere comprising silicon to deposit the silicon epitaxial layer onto the surface to form the epitaxial wafer.

26. The process of claim 13 wherein the process comprises:
heating the surface of the wafer starting material to a temperature of at least about 1100° C. in the essentially oxidant-free atmosphere to remove the silicon oxide layer from the surface, and
within about 10 seconds after the surface reaches 1100° C., exposing the surface to the atmosphere comprising silicon to deposit the silicon epitaxial layer onto the surface to form the epitaxial wafer.

27. The process of claim 13 wherein the heating and cooling of the epitaxial wafer are conducted in a reactor constructed for depositing a silicon epitaxial layer onto a surface of a wafer, and the epitaxial wafer is supported on a susceptor during the heating step and is removed from contact with the susceptor during the cooling step.

28. A process for the preparation of a silicon wafer comprising a surface having an epitaxial layer deposited thereon, the process comprising:
heating a surface of a wafer starting material to a temperature of at least about 1150° C. in an essentially oxidant-free atmosphere to remove a silicon oxide layer from the surface,
within about 30 seconds after the surface reaches 1150° C., exposing the surface to an atmosphere comprising silicon to deposit a silicon epitaxial layer onto the surface to form an epitaxial wafer,
heating the epitaxial wafer to a soak temperature of at least about 1175° C. while exposing the epitaxial layer to an oxidizing atmosphere comprising an oxidant, and
cooling the heated epitaxial wafer at a rate of at least about 10° C./sec.

29. The process of claim 28 wherein the process comprises:
heating the surface of the wafer starting material to a temperature of at least about 1150° C. in the essentially oxidant-free atmosphere to remove the silicon oxide layer from the surface, and
within about 20 seconds after the surface reaches 1150° C., exposing the surface to the atmosphere comprising silicon to deposit the silicon epitaxial layer onto the surface to form the epitaxial wafer.

30. The process of claim 28 wherein the process comprises:
heating the surface of the wafer starting material to a temperature of at least about 1150° C. in the essentially oxidant-free atmosphere to remove the silicon oxide layer from the surface, and
within about 10 seconds after the surface reaches 1150° C., exposing the surface to the atmosphere comprising silicon to deposit the silicon epitaxial layer onto the surface to form the epitaxial wafer.

31. The process of claim 28 wherein the average cooling rate of the wafer is at least about 15° C./sec as it cools from the soak temperature to about 150° C. below the soak temperature.

32. The process of claim 28 wherein the average cooling rate of the wafer is at least about 20° C./sec as it cools from the soak temperature to about 150° C. below the soak temperature.

33. The process of claim 28 wherein the average cooling rate of the wafer is at least about 50° C./sec as it cools from the soak temperature to about 150° C. below the soak temperature.

34. A process for the preparation of a silicon wafer comprising a surface having an epitaxial layer deposited thereon, the process comprising:
depositing an epitaxial layer onto a surface of a wafer to form an epitaxial wafer,
heating the epitaxial wafer to a soak temperature of at least about 1175° C. while exposing the epitaxial layer to an oxidizing atmosphere comprising an oxidant, and
cooling the heated epitaxial wafer at a rate of at least about 10° C. /sec.,
wherein the epitaxial layer is not contacted with a post-epitaxial-deposition cleaning solution before the epitaxial wafer is heated to the soak temperature.

35. The process of claim 34 wherein the oxidant is $O_2$.

36. A process for the preparation of a silicon wafer comprising a surface having an epitaxial layer deposited thereon, wherein the epitaxial layer has a thickness of at least about 0.1 μm and less than 2.0 μm, and the process comprises:
heating a wafer comprising a surface with an epitaxial layer deposited thereon to a soak temperature of at least about 1175° C. while exposing the epitaxial layer to an oxidizing atmosphere comprising an oxidant, and
cooling the heated wafer at a rate of at least about 10° C./sec.

37. The process of claim 36 wherein the oxidant is $O_2$.

38. The process of claim 36 wherein the epitaxial layer has a thickness of from about 0.25 to about 1.0 μm.

39. The process of claim 36 wherein the epitaxial layer has a thickness of from about 0.65 to about 1.0 μm.

40. A process for the preparation of a silicon wafer comprising a surface having an epitaxial layer deposited thereon, the process comprising:
depositing an epitaxial layer onto a surface of a wafer starting material to form an epitaxial wafer,
heating the epitaxial wafer to a soak temperature of at least about 1175° C. while exposing the epitaxial layer to an oxidizing atmosphere comprising an oxidant, and
cooling the heated epitaxial wafer at a rate of at least about 10° C. /sec.,
wherein the surface of the wafer starting material, before deposition of the epitaxial layer thereon, has an average light scattering event concentration of at least about 0.5/cm$^2$ as measured by a laser-based auto inspection tool configured to detect light scattering events corresponding to polystyrene spheres having diameters of no less than about 0.12 μm.

41. The process of claim 40 wherein the average light scattering event concentration is from about 0.5 to about 10/cm$^2$.

42. The process of claim 40 wherein the average light scattering event concentration is from about 0.5 to about 3.5/cm$^2$.

43. The process of claim 40 wherein the average light scattering event concentration is from about 0.6 to about 1.6/cm$^2$.

44. A process for the preparation of a silicon wafer comprising a surface having an epitaxial layer deposited thereon, the process comprising:
heating a surface of a wafer starting material to a temperature of at least about 1150° C. in an atmosphere consisting essentially of $H_2$ to remove a silicon oxide layer from the surface,
within about 10 seconds after the surface reaches 1150° C., exposing the surface to an atmosphere comprising $SiHCl_3$ to deposit a silicon epitaxial layer onto the surface to form an epitaxial wafer,
heating the epitaxial wafer to a soak temperature of at least about 1175° C. while exposing the epitaxial layer to an oxidizing atmosphere comprising $O_2$, and
cooling the heated epitaxial wafer from the soak temperature to 250° C. below the soak temperature at an average rate of at least about 20° C./sec,
wherein the epitaxial layer has a thickness of from about 0.65 to 1.0 μm, and the concentration of the $O_2$ in the oxidizing atmosphere is from about 300 to about 500 ppm.

45. A process for heating and rapidly cooling a single crystal silicon wafer in a reactor constructed for depositing a silicon epitaxial layer onto a surface of a wafer, the process comprising the steps of:
heating the wafer to a soak temperature of at least about 1175° C., and
cooling the heated wafer at a rate of at least about 10° C./sec.,
wherein the wafer is supported on a susceptor during the heating step and is removed from contact with the susceptor during the cooling step.

46. The process of claim 45 wherein the cooling rate is at least about 15° C./sec.

47. The process of claim 45 wherein the cooling rate is at least about 20° C./sec.

48. The process of claim 45 wherein the cooling rate is from about 25 to about 30° C./sec.

49. The process of claim 45 wherein the wafer is supported on pins during the cooling step.

* * * * *